United States Patent [19]

Swartz et al.

[11] 4,434,391

[45] Feb. 28, 1984

[54] CAPACITIVE FEEDBACK TRANSDUCER AND CLOSED LOOP INSTRUMENT METER MECHANISM

[75] Inventors: Harold L. Swartz, Glendale; Randal A. Atkeisson, Phoenix; Rodney A. Carter, Phoenix; Russell C. Parker, Phoenix, all of Ariz.

[73] Assignee: Sperry Corporation, New York, N.Y.

[21] Appl. No.: 339,541

[22] Filed: Jan. 15, 1982

[51] Int. Cl.³ .............................................. G05B 6/02
[52] U.S. Cl. ............................... 318/662; 340/870.37; 361/292
[58] Field of Search .................. 318/662; 340/870.37; 361/277, 278, 289, 292

[56] References Cited

U.S. PATENT DOCUMENTS

| | | | |
|---|---|---|---|
| 2,964,704 | 12/1960 | Shapiro | 361/289 X |
| 3,007,093 | 10/1961 | Potter et al. | 361/292 |
| 3,080,513 | 3/1963 | Edwards | 361/662 |
| 3,683,402 | 8/1972 | Parnell | 318/662 |
| 3,784,897 | 1/1974 | Norrie | 361/292 |
| 3,928,796 | 12/1975 | Kaiser | 318/662 X |
| 4,092,579 | 5/1978 | Weit | 318/662 |
| 4,323,903 | 4/1982 | Fauerskov et al. | 318/662 |

Primary Examiner—B. Dobeck
Attorney, Agent, or Firm—Howard P. Terry

[57] ABSTRACT

A display pointer is driven back and forth along a predetermined path by a geared-down miniature d.c. servomotor in accordance with a command signal. The path is determined by an elongated printed circuit board base having closely adjacent, elongated, coextensive triangularly shaped plates thereon, constituting stationary capacitor plates of a pair of variable capacitors. The printed circuit board includes a dielectric material which also overlays the triangular plates. A relatively narrow, electrically conductive slider member extends laterally across the triangular plates and is supported by and rides on the printed circuit board and constitutes a common movable capacitor plate for the variable capacitors. The display pointer is attached to and positioned by the slider. The slider in turn is displaced along the printed circuit board by means of a cable and pulley mechanism coupled to the servomotor. The pair of variable capacitors are electrically connected with a pair of diodes in balanced bridge fashion in order to provide a signal proportional to the position of the slider along the path. The position signal is fed back and summed with the command signal to provide an error signal for controlling the servomotor.

12 Claims, 8 Drawing Figures

CAPACITIVE FEEDBACK TRANSDUCER AND CLOSED LOOP INSTRUMENT METER MECHANISM

BACKGROUND OF THE INVENTION

1. Field of the Invention

The present invention relates to meter mechanisms for electromechanical instruments, and more specifically to a flight instrument having an indicator which is positioned by a miniature servomotor and a novel capacitive position feedback transducer.

2. Description of the Prior Art

Flight instruments having a meter movement for positioning an indicator or pointer are well known in the art and a representative example is described in U.S. Pat. No. 3,577,195, by C. Clift, issued May 4, 1971, and assigned to the applicants' assignee. The aforementioned Clift patent discloses a D'Arsonval type of meter movement which is responsive to a control signal and which has an auxiliary a.c. excitation winding on the field magnet, thereby providing both a unidirectional flux field and an alternating flux field for the meter movement magnetic circuit. The meter armature has two windings. The first winding is excited by the control signal and reacts with the directional magnetic field to displace an armature, and the second winding operates to sense both the displacement of the armature and the rate of change of the displacement by acting respectively with the alternating and unidirectional magnetic fields. When included in a closed loop servo system the meter movement operates as both a servodrive and an angular motion transducer for providing displacement and rate feedback terms.

Flight instruments, for example an attitude director indicator, typically include pointers and arms coupled to the armatures of the above described type of meter movement. The travel arcs of these pointers and arms have their centers of curvature or pivot points disposed at some distance from a display surface. This arrangement results in a major alignment problem for the pointers since small displacements of the meter movement bodies, which are subject to mounting constraints, effect the pivot points and are amplified through the arms to the pointers.

The prior art has attempted to solve these alignment problems with relatively complex devices of the type described in U.S. Pat. No. 3,599,597, by Maday et al., issued Aug. 17, 1971, and assigned to the applicants' assignee. The apparatus of the Maday patent provides means for aligning the meter pointers so that they have adequate clearance from other components. For example, in an attitude flight indicator, each meter is disposed relative to three set screws arranged in a triangular pattern and threaded through a meter support structure into contact with the meter. To orient the pointer, the meter is temporarily loosened from its rigid connection to the support structure. This enables the set screws to be adjusted so as to move the meter pointer relative to an indicator housing. After the pointer has been appropriately positioned so that it can move along a prescribed path without contacting other components, the meter is again rigidly clamped to the support structure in readiness for normal operation. Additional set screws adjusted in relation to other meters permit the individual pointers to be separately aligned in a similar manner. It can be appreciated from the foregoing that flight instruments utilizing the apparatus of the Maday patent are relatively difficult and time consuming to manufacture.

Accordingly, there is a need for a servo controlled pointer system suitable for use in flight instruments and other electromechanical instruments which alleviates the alignment and manufacturing problems associated with prior art systems.

SUMMARY OF THE INVENTION

The apparatus of the present invention provides a servo-controlled meter mechanism having a novel capacitive feedback transducer which is well adapted for use in positioning pointers and the like in flight instruments.

The capacitive feedback transducer is comprised of a pair of variable capacitors formed on a substrate such as a printed circuit board. Preferably, the variable capacitors are formed from at least first and second tapered or generally coextensive triangular conductive plates disposed between at least first and second generally rectangular ground plates on the surface of the printed circuit board. The stationary triangular conductive plates and the stationary ground plates are coated with a thin dielectric material, and a slideable conductive plate which rides on the edge of the printed circuit board varies the effective areas of the variable capacitors as it moves parallel to the stationary plates. The variable capacitors, a pair of diodes, and a pair of resistors may be used to form a bridge circuit useful for providing a measure of the difference in capacitance between the two variable capacitors and hence the position of the slider.

In a flight instrument such as an attitude director indicator, a plurality of servo controlled meter mechanisms comprised of a miniature d.c. servomotor and the capacitive feedback transducer may be effectively employed to position pointers. The pointers are fixed to the slideable member of the capacitive feedback transducers. The miniature servomotor is coupled to a geartrain and pulley. A wire or flexible string which has its ends fastened to the slideable plate of the capacitive feedback transducer is preferably threaded through the servomotor's pulley and a pair of pulleys disposed on the printed circuit board of the capacitive feedback transducer. The servomotor is responsive to command signals and as the servomotor rotates, the slideable conductive plate is disposed across the stationary triangular conductive plates and ground plates. The difference in capacitance between the two variable capacitors is a useful position signal which may be summed with the command signals to provide the servomotor with an error signal for positively positioning the pointer coupled to the slideable conductive plate.

DESCRIPTION OF THE PREFERRED EMBODIMENTS

Figure 1:
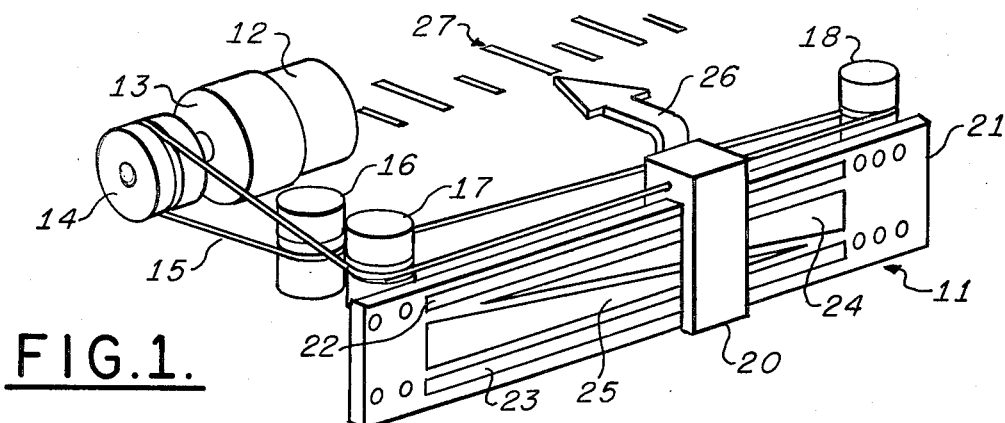
FIG. 1 is an illustration of the miniature servomotor and capacitive feedback transducer of the present invention.

Referring now to FIG. 1, an illustration of a servo system 10 having a capacitive feedback transducer 11 is provided. The servo system 10 includes a miniature d.c. servomotor 12 coupled to a gear train 13 and a pulley 14. A cable 15 is threaded through pulley 14 as well as pulleys 16, 17 and 18. The cable 15 is fastened to a sliding brass conductive plate 20 of the capacitive feedback transducer 11. The capacitive feedback transducer 11 is comprised of a pair of variable capacitors formed on a substrate such as printed circuit board 21.

Figure 4:
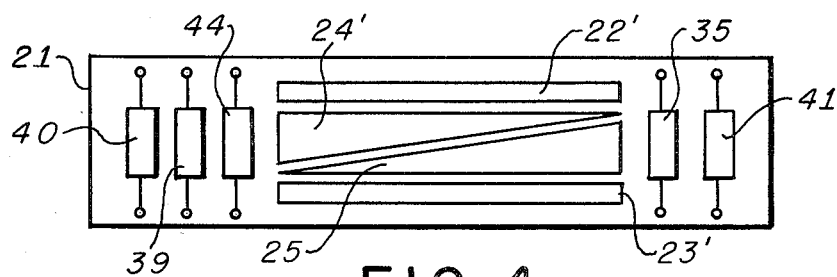
FIG. 4 is a rear view of the capacitive feedback transducer of FIG. 1.

Preferably, the variable capacitors include the slideable conductive plate 20, generally rectangular ground plates 22 and 23, and the tapered or generally triangular coextensive conductive plates 24 and 25. The plates 22, 23, 24, 25 are deposited on a standard fiberglass substrate such as printed circuit board 21 using conventional printed circuit board fabrication techniques. Preferably, as depicted in FIG. 4, the reverse side of the printed circuit board 21 includes a plurality of plates 22', 23', 24', 25' which are a mirror image of the plates shown in FIG. 1. All of the plates are coated with a thin dielectric material on the order of 0.012 inches thick, such as mylar or a fiberglass laminate. The pointer 26, which is disposed in operative relationship to a graduated scale 27, is fixed to the sliding conductive plate 20 as hereinafter described in greater detail.

Figure 2:
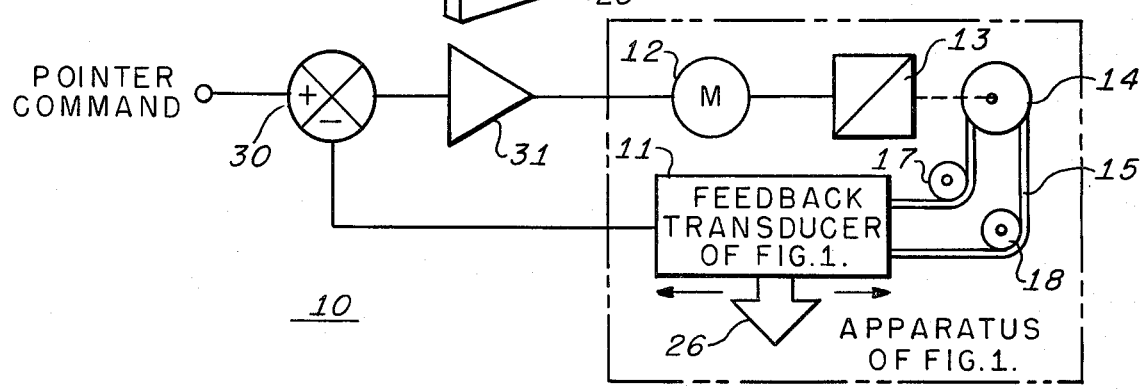
FIG. 2 is a schematic diagram of the servo system associated with the apparatus of FIG. 1.

Referring now to FIG. 2, a schematic diagram illustrates the servo system 10 utilizing the miniature servomotor 12 and the capacitive feedback transducer 11. A summing junction 30 is responsive to the output of the capacitive feedback transducer 11 and a source of pointer command signals (not shown) such as a computer or other processing means. The output of the summing junction 30 is applied to an amplifier 31 which drives the servomotor 12, the gear train 13, and the pulley 14 in a conventional fashion. The cable 15 transmits the rotational displacement of pulley 14 to the capacitive feedback transducer 11 and pointer 26 via the pulleys 17, 18. The electrical output of the capacitive feedback transducer 11 is a position signal which is applied to the summing junction 30 in a conventional fashion in order to provide the servomotor 12 with an error signal.

Figure 3:
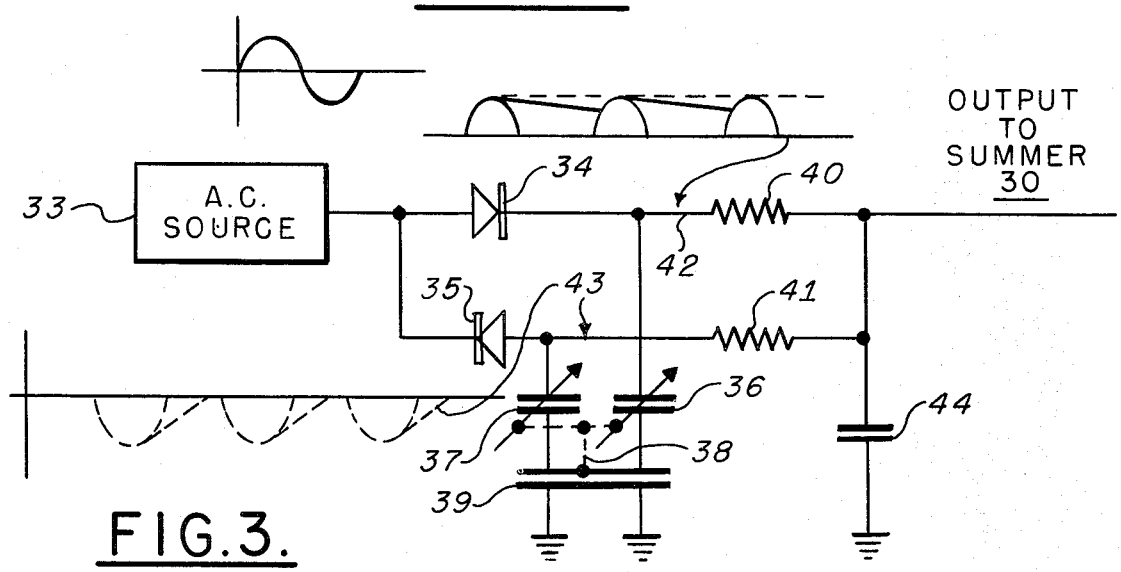
FIG. 3 is a schematic diagram of an electrical bridge circuit utilized in conjunction with the capacitive feedback transducer.

Referring now to FIG. 3, a schematic diagram of an electrical bridge circuit well adapted for use with the capacitive feedback transducer 11 and the servo system 10 is provided. It should be pointed out that the electrical bridge circuit of FIG. 3 is somewhat similar to a circuit disclosed in U.S. Pat. No. 3,012,192, by K. S. Lion, and issued Dec. 5, 1961. In the present invention, an a.c. source 33 is coupled to steering diodes 34, 35 and the steering diodes 34, 35 operate as half wave rectifiers. The output of the steering diode 34 is a pulse train of half wave rectified positive pulses, and the output of the steering diode 35 is a pulse train of half wave rectified negative pulses. Variable capacitors 36, 37 are coupled to the output of the steering diodes 34, 35 respectively. The variable capacitors 36, 37 are the variable capacitors of the capacitive feedback transducer 11 which are formed on the printed circuit board 21 as described above. The slideable conductive plate 20 acts as the mechanical linkage 38 between variable capacitors 36, 37. Moreover, the interface between the slideable conductive plate 20 and the ground plates 22, 23 of FIG. 1 acts as a capacitive pickoff 39 which couples the variable capacitors 36, 37 to ground. It can be appreciated that the variable capacitor 36 is driven by the positive pulses from the steering diode 34 and coupled to ground via the capacitive pickoff 39. It can be further appreciated that the variable capacitor 37 is driven by the negative pulses from the steering diode 35 and is also coupled to ground via the capacitive pickoff 39. The output of the variable capacitors 36, 37 are represented by the waveforms at points 42, 43 of the circuit, and these outputs are applied to the summing junction 30 via the resistors 40, 41 and the filter capacitor 44. Preferably, the steering diodes 34 and 35, the resistors 40 and 41, and the filter capacitor 44 are disposed on the reverse side of the printed circuit board 21 as depicted on FIG. 4.

When the slider 20 is positioned at the midpoint of the generally triangular plates 24, 25, the capacitance of the variable capacitors 36, 37 and their output voltages are equal but of opposite polarities. When the slider 20 is positioned to either side of the midpoint of the triangular conductive plates 24, 25, the capacitances of the variable capacitors 36, 37 are unequal. Consequently the variable capacitors 36, 37 have unequal decay times and the voltages appearing at points 42, 43 of the circuit are unequal, i.e., one is larger than the other. It should be noted that the decay time of variable capacitors 36, 37 will effect the slope of the voltages at points 42, 43. The summing resistors 40, 41 sum the voltages at points 42, 43. Thus, a sum which is no longer zero, when the slider is not at the midpoint of capacitive feedback transducer 11, provides a bipolar pickoff voltage proportional to the position of the slider 20. As mentioned above, this position or pickoff voltage is summed with a command voltage at the summing junction 30 and the resulting signal is amplified in order to drive the servomotor 12. In turn, the servomotor 12 drives the slider 20 and the pointer 26. Thus an input command voltage may be used to drive the servomotor 12, the slider 20 and the pointer 26, until the pickoff or position voltage provided by the capacitive feedback transducer 11 is equal but of opposite polarity to the command voltage.

Figure 5:
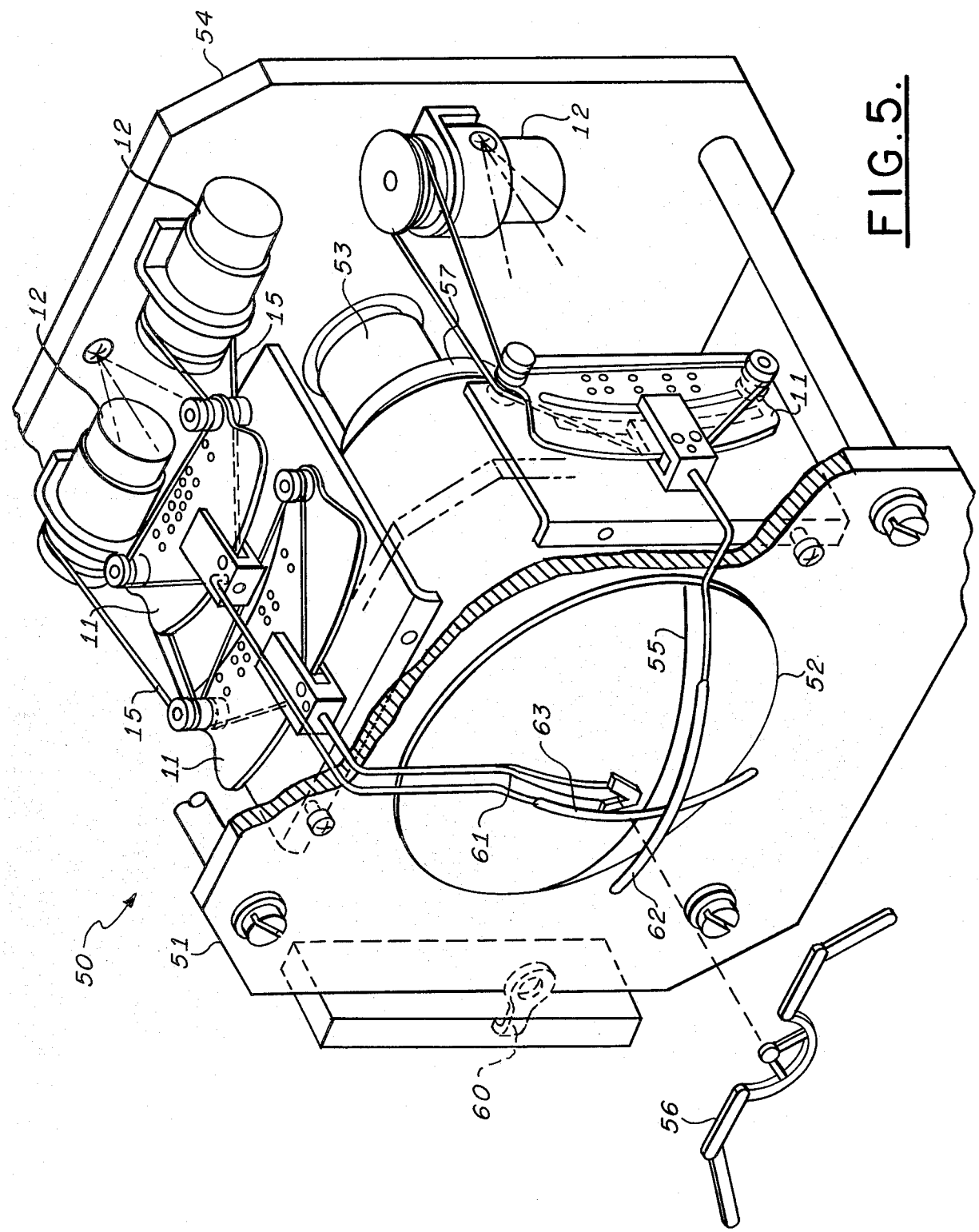
FIG. 5 is a partial illustration of a flight director indicator having a plurality of pointers positioned by the servomotor and capacitive feedback transducer of the present invention.

The above described servo system 10 is well adapted for use in positioning a pointer in a flight instrument such as an attitude director indicator 50 of the type illustrated in FIG. 5. Attitude director indicators are well known in the art and generally described in U.S. Pat. No. 2,821,695 by Strock, issued Jan. 28, 1958 and assigned to the applicants' assignee. The attitude director indicator 50 typically includes a case 51, a hemispherical member 52 and a viewing window (not shown). The hemispherical member 52 is pivotally supported on a member such as a U-shaped gimbal member 57 for relative movement about an axis which is normally parallel to the pitch axis of the aircraft. The gimbal member 57, in turn, is pivotally supported by means of an elongated trunnion 53 journalled in a suitable support wall 54 for rotation about an axis parallel to the roll axis of the aircraft. Thus, with the above described gimbal construction the hemispherical member 52 is adapted to be positioned relative to the roll and pitch axis of the aircraft. The hemispherical member 52 is provided with a horizontal defining line 55 which may be delineated on the surface of the hemispherical member 52. The area above the horizon line 55 is preferably of a light color and the area below the horizon line being of preferably a darker or contrasting color. The hemispherical member 52 is positioned by a suitable servo mechanism (not shown) to provide the pilot with a graphical representation of ther horizontal surface of the earth. An index 56 conventionally configured to represent the wing span of a miniature aircraft is fixed to the housing 51 behind the viewing window.

The attitude director indicator 50 typically includes a plurality of servo controlled pointers which may advantageously be positioned by the apparatus of the present invention. In FIG. 5 four such pointers are illustrated, the doughnut shape speed command indicator 60, the V-shaped rudder pointer 61, the horizontal flight director bar 62 and the vertical flight director bar 63. The speed command pointer 60 is shown coupled to a capacitive feedback transducer 11 but the associated servomotor is not visible. The pointers 61, 62, 63, however, are illustrated as being coupled to capacitive feedback transducers 11 and their respective miniature servomotors 12 via cables 15. The capacitive feedback transducers 11 and the miniature servomotors 12 of FIG. 5 are of the type described in conjunction with FIGS. 1-4.

Figure 6:
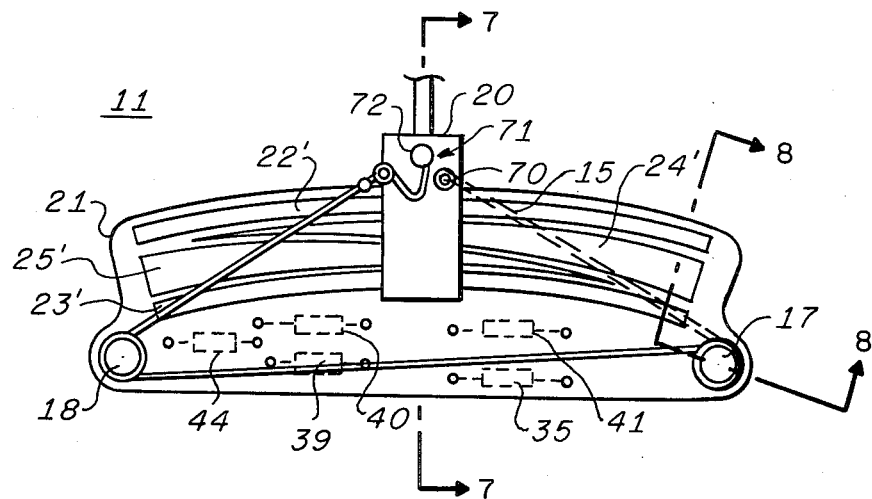
FIG. 6 is a front view of the capacitive feedback transducer and the associated circuitry utilized in the apparatus of FIG. 5.
Figure 7:
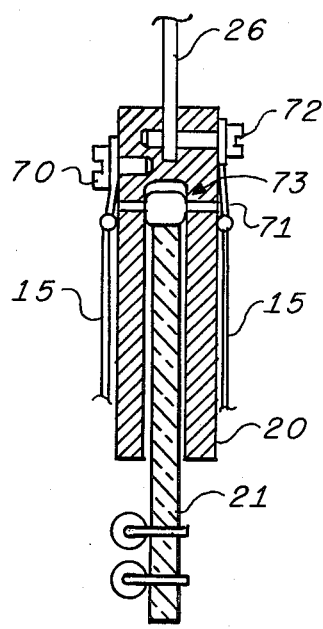
FIG. 7 is a cross sectional side view of the capacitive feedback transducer taken along section 7—7 of FIG. 6.
Figure 8:
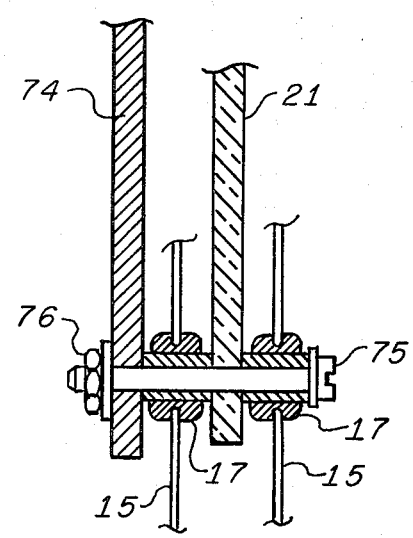
FIG. 8 is a cross sectional end view of the capacitive feedback transducer taken along section 8—8 of FIG. 6.

Referring now to FIGS. 6, 7, and 8, views of a representative capacitive feedback transducer 11 utilized in the attitude director indicator 50 of FIG. 5 are provided. FIG. 6 illustrates in detail the slider 20, the wire 15, and the pulleys 17 and 18 which are disposed on the printed circuit board 21. The cable 15, which is of a type used in radio tuners or of a high quality fish line, is threaded through pulleys 17, 18. One end of the cable 15 is secured to the one side of the slider 20 by a screw 70, and the other end of the wire 15 is secured to the reverse side of slider 20 by a spring loop 71 and a screw 72. The spring loop 71 can be used to adjust the tension of the wire 15.

Referring now to FIG. 7, a cross sectional view of the capacitive feedback transducer 11 taken along section 7—7 of FIG. 6 is provided. A roller 73 is disposed within the slot formed between the bifurcated portions of the slider 20. The roller 73 rides along an edge of the printed circuit board 21, thereby reducing friction between the slider 20 and the printed circuit board 21. The screw 72 which secures the spring loop 71 to the slider 20 may also be utilized to secure the pointer 26 to the slider 20. The tension exerted by the wire 15 on opposite sides of the slider 20 is sufficient to maintain vertically the slider 20 as it is displaced across the edge of the printer circuit board 21.

Referring now to FIG. 8, it can be appreciated that the pulley 17 is attached to a support member 74 by a bolt 75 and a nut 76. The support member 74 would typically be attached to the case 51 or support wall 54 of the attitude director indicator 50 of FIG. 5. The printed circuit board 21 may also be advantageously disposed between the wheels of the pulley 17 in order to permit the cable 15 to run parallel to both sides of the printed circuit board 21 and the slider 20.

While the invention has been described in its preferred embodiments, it is to be understood that the words which have been used are words of description rather than limitation and that changes may be made within the purview of the appended claims without departing from the true scope and spirit of the invention in its broader aspects.

We claim:

1. A flight instrument for physically displaying command signals to a pilot, comprising:
   a case,
   servomotor means coupled to said case and responsive to said command signals for providing rotational displacement;
   a capacitive transducer having at least first and second variable capacitors responsive to the rotational displacement of said servomotor means for providing feedback signals to said servomotor means, including;
   a substrate mounted on said case;
   a first tapered conductive plate disposed on said substrate;
      a second tapered conductive plate disposed on said substrate and substantially coextensive with said first conductive plate;
   conductive means mounted to slide parallel to said substrate in response to the rotational displacement of said servomotor means in operative relationship with said first and second tapered conductive plates; and
   means for coupling said sliding conductive means to ground;
   bridge circuit means for providing output signals proportional to the difference in capacitance of said first and second variable capacitors including:
      first rectifying means and first resistance means which are coupled to said first variable capacitor;
   second rectifying means, oppositely poled to said first rectifying means, and second resistance means coupled to said second variable capacitor;
   means for applying an alternating current to said first and second rectifying means; and
   capacitive filter means coupled between ground and said first and second resistance means; and
   a pointer coupled to said sliding conductive means, for providing the pilot with a visual display corresponding to said command signals.

2. An apparatus according to claim 1 wherein said means for coupling said sliding conductive means to ground includes ground plate means disposed on said substrate, in operative relationship with said sliding conductive means.

3. An apparatus according to claim 2 wherein said first and second conductive plates have generally triangular shapes.

4. An apparatus according to claim 2 wherein said substrate is fabricated from a dielectric material and has first and second substantially parallel surfaces with tapered conductive means, said second tapered conductive means and said ground plate means are disposed on said first and second surfaces in substantially mirror image relationship with a layer of said dielectric material thereover.

5. An apparatus according to claim 4 wherein said slidable conductive means includes a bifurcated slider having a first portion disposed parallel to said first surface of said substrate and a second portion disposed parallel to said second surface of said substrate, said first and second portions having a slot therebetween and and in operative relationship with said tapered conductive means and said ground plate means.

6. An apparatus according to claim 5 which includes a roller disposed in said slot of said bifurcated slider to ride along an edge of said substrate.

7. An apparatus according to claim 6 which further includes at least two pulleys disposed on said substrate and a cable threaded therethrough and coupled to said first and second portions of said bifurcated slider.

8. An apparatus according to claim 7 wherein an end of said cable is coupled to said bifurcated slider by means for adjusting the tension of said cable.

9. An apparatus according to claim 2 wherein said first and second rectifying means include diodes disposed upon said substrate, said first and second resistance means include resistors disposed upon said substrate, and said capacitive filter means includes a capacitor disposed upon said substrate.

10. An apparatus according to claim 1 wherein said servomotor means includes a summing junction for summing the feedback signals from said capacitive transducer with said command signals.

11. An apparatus according to claim 10 wherein said servomotor means includes means for amplifying the output of said summing junction and driving a d.c. motor coupled to a gear train and pulley.

12. An apparatus according to claim 11 wherein said sliding conductive means of said capacitive transducer is coupled to said pulley of said servomotor means by at least a pair of pulleys disposed on said substrate and a wire.

* * * * *